(12) United States Patent
Allirot et al.

(10) Patent No.: US 10,669,748 B2
(45) Date of Patent: Jun. 2, 2020

(54) LOCKING BRACKET FOR LOCKING A DIGITAL DEVICE INTO A CASING

(71) Applicant: INGENICO GROUP, Paris (FR)

(72) Inventors: Richard Allirot, Corenc (FR); Alain Soubirane, Bourg-les-Valence (FR); Damien Cochet, Barbieres (FR)

(73) Assignee: INGENICO GROUP, Paris (FR)

( * ) Notice: Subject to any disclaimer, the term of this patent is extended or adjusted under 35 U.S.C. 154(b) by 0 days.

(21) Appl. No.: 15/900,001

(22) Filed: Feb. 20, 2018

(65) Prior Publication Data

US 2018/0238083 A1    Aug. 23, 2018

(30) Foreign Application Priority Data

Feb. 20, 2017 (FR) .................................. 17 51333

(51) Int. Cl.
| | |
|---|---|
| *E05B 73/00* | (2006.01) |
| *H05K 5/02* | (2006.01) |
| *F16M 13/02* | (2006.01) |
| *A47F 9/04* | (2006.01) |

(52) U.S. Cl.
CPC ....... *E05B 73/0082* (2013.01); *H05K 5/0221* (2013.01); *A47F 9/04* (2013.01); *F16M 13/02* (2013.01)

(58) Field of Classification Search
CPC .. E05B 73/0082; H05K 5/0221; F16M 13/02; A47F 9/04
USPC .............. 70/58, 14, 57, 57.1, 164, 360, 361, 70/423–428, 455; 248/551–553; 361/679.57, 679.58
See application file for complete search history.

(56) References Cited

U.S. PATENT DOCUMENTS

| | | | | |
|---|---|---|---|---|
| 4,907,716 A | * | 3/1990 | Wankel ................. | E05B 35/008 220/326 |
| 5,050,836 A | * | 9/1991 | Makous .............. | E05B 73/0005 248/553 |
| 5,327,752 A | * | 7/1994 | Myers .................. | E05B 27/083 248/553 |
| 5,351,508 A | * | 10/1994 | Kelley ................ | E05B 73/0005 16/445 |
| 5,406,809 A | * | 4/1995 | Igelmund ............ | E05B 73/0005 248/552 |

(Continued)

FOREIGN PATENT DOCUMENTS

| | | |
|---|---|---|
| EP | 2721232 A1 | 8/2016 |
| WO | 2012173764 A1 | 12/2012 |

OTHER PUBLICATIONS

French Search Report dated Oct. 9, 2017 for French Application No. 1751333, filed Feb. 20, 2017.

(Continued)

*Primary Examiner* — Lloyd A Gall
(74) *Attorney, Agent, or Firm* — David D. Brush; Westman, Champlin & Koehler, P.A.

(57) ABSTRACT

A locking bracket for locking a digital device preliminarily inserted into a casing. The locking bracket includes an internal face for receiving at least one portion of the digital device and an external locking face. The locking bracket includes elements for assembling the locking bracket with the casing; elements for retaining the digital device; and at least one locking unit having a lock for locking the bracket to the casing.

7 Claims, 6 Drawing Sheets

(56) References Cited

U.S. PATENT DOCUMENTS

| | | | | |
|---|---|---|---|---|
| 5,709,110 | A * | 1/1998 | Greenfield | E05B 73/0005 248/553 |
| 6,227,017 | B1 * | 5/2001 | Igelmund | E05B 73/0005 70/14 |
| 6,257,029 | B1 * | 7/2001 | Liao | E05B 73/0005 248/551 |
| 6,449,992 | B1 * | 9/2002 | Yu | E05B 73/0082 70/23 |
| 6,581,420 | B1 * | 6/2003 | Ling | E05B 73/0082 248/551 |
| 6,731,500 | B2 * | 5/2004 | Allirot | G06F 1/181 361/679.34 |
| 6,742,366 | B1 * | 6/2004 | Lai | E05B 37/025 70/30 |
| 7,028,513 | B2 * | 4/2006 | Avganim | E05B 73/0082 70/159 |
| 7,299,668 | B1 * | 11/2007 | Lu | E05B 73/0082 70/14 |
| 7,409,842 | B2 * | 8/2008 | Kuo | E05B 13/105 70/360 |
| 7,565,824 | B1 * | 7/2009 | Gleason | E05B 73/0005 248/552 |
| 7,724,520 | B2 * | 5/2010 | Allen | E05B 73/0082 211/8 |
| 8,418,514 | B1 | 4/2013 | Su | |
| 8,869,573 | B2 * | 10/2014 | Myers | E05B 73/0005 70/58 |
| 8,881,560 | B2 * | 11/2014 | Avganim | E05B 73/0082 70/158 |
| 9,032,766 | B2 * | 5/2015 | Su | E05B 73/0082 70/14 |
| 9,410,344 | B2 * | 8/2016 | Stacey | E05B 73/0082 |
| 9,500,010 | B2 * | 11/2016 | Lin | E05B 73/0082 |
| 9,575,506 | B2 * | 2/2017 | Lee | G06F 1/1626 |
| 9,727,085 | B2 * | 8/2017 | Weldon | G06F 1/1632 |
| 2004/0177658 | A1 * | 9/2004 | Mitchell | E05B 73/0082 70/58 |
| 2011/0283751 | A1 * | 11/2011 | Avganim | E05B 73/0005 70/18 |
| 2014/0124644 | A1 * | 5/2014 | Wong | E05B 73/0082 248/553 |
| 2014/0238091 | A1 * | 8/2014 | Allen | E05B 73/0082 70/58 |
| 2015/0159405 | A1 * | 6/2015 | Calkins | E05B 73/0082 70/431 |
| 2015/0305518 | A1 * | 10/2015 | Galant | F16M 11/041 248/551 |
| 2016/0090755 | A1 * | 3/2016 | Lee | E05B 73/0082 248/553 |
| 2016/0224065 | A1 | 8/2016 | Weldon | |

OTHER PUBLICATIONS

French Written Opinion and English Translation dated Oct. 9, 2017 for French Application No. 1751333, filed Feb. 20, 2017.

* cited by examiner

LOCKING BRACKET FOR LOCKING A DIGITAL DEVICE INTO A CASING

1. FIELD OF THE INVENTION

The field of the invention is that of devices for securing digital devices. More particularly, the invention relates to anti-theft devices used to secure a touchpad tablet or a smartphone inside a casing.

2. PRIOR ART

The market for portable digital devices (smartphones, tablets, etc.) is growing. Beyond the marked popularity of such devices among the general public, professionals too are rapidly becoming aware of the numerous possibilities offered by these highly versatile tools. Touchpad tablets for example receive very special attention from sales outlet managers, and novel uses have been developed around these relatively inexpensive apparatuses which are becoming increasingly powerful, connected and compact, and have comfortably sized screens. Many specific applications have thus been developed to meet different needs. Certain merchant-oriented applications have thus appeared. For example, solutions have emerged to replace traditional cash registers with touchpad tablets integrating suitable cash register software. For the sales outlet manager, these solutions offer numerous advantages as compared with conventional cash registers: they are less costly and more compact and the embedded cash register software can be easily updated when novel functions become available. In addition, they offer the merchant greater flexibility by enabling him for example to favor solutions based on a touchpad tablet that he is familiar with and knows well enough to use in other contexts. Besides, the touchpad tablet, intrinsically a mobile, connected device, opens up novel working opportunities: this new type of cash register no longer has fixed residence in a business establishment, and the merchant can for example easily carry it home or to his accountant in order to prepare various statements or balance sheets.

To accompany these novel uses, it has been necessary to propose devices that hold the digital devices in positions suited to their use. Thus, cradles specially designed to receive these digital devices have been developed and marketed. The use of these intrinsically portable digital devices in very busy places such as sales outlets has also led to a need to secure them. They require not only physical protection but also protection against theft by malicious individuals. Such security is for example implemented by means of a classic lock-and-key system used to close a frame, also called a casing, in which the digital device is held. Numerous casing systems have therefore been proposed. Their purpose is firstly to hold the digital device positioned within them and, secondly, to secure this digital device.

However, the different users of these casing do not necessarily have the same security requirements: while certain users seek above all to obtain a simple holding solution that enables the relatively easy and rapid removal of the digital device, others need a higher level of anti-theft security (for example because the digital device is not under constant surveillance by the merchant). Thus, the user is generally led at the very outset to choose a very specific type of casing that meets initial needs. This solution however is relatively rigid: if the user's security needs change (for example because of a different configuration of his premises after relocation or an increase in the number of customers at his establishment), he often has no choice but to purchase a new casing that is better suited to his new needs, and this can prove to be costly. This also imposes constraints on the casing manufacturer who has to develop and maintain a range of different casings in order to be capable of offering his customers solutions adapted to each situation. The costs associated with the maintaining of a range comprising several types of casing are great and it would be worthwhile for the manufacturer to benefit from a solution enabling economies of scale.

There is therefore a need for a more modular solution that enables the use of one and the same casing to adapt the level of security of the device that is installed therein.

3. SUMMARY

The present technique partly resolves the problems raised by the prior art. The present technique indeed relates to a locking bracket for locking a digital device preliminarily inserted into a casing. The bracket comprises an internal face for receiving at least one portion of the digital device and an external face called a locking face. It also comprises:
  means of assembling with said casing;
  means for retaining said digital device;
  at least one locking unit comprising locking means for locking the bracket to said casing Thus, the locking bracket is an ingenious accessory that can be assembled with a casing (that can also be used independently) so as to reinforce the anti-theft protection of the digital device that is installed within the casing. The retaining means retain the digital device in the casing, once the locking bracket is assembled with the casing, and the locking unit prevents the dismantling of the locking bracket (i.e. its dismantling from the casing) by an unauthorized individual. Thus, these three main elements of the locking bracket—assembling means, retaining means and locking unit—cooperate to act against the unauthorized withdrawal of a digital device that has been previously installed in the casing. The user thus has an accessory that offers him the possibility of boosting the security level of a casing that he already possesses and therefore does not need to replace.

In one particular embodiment, the locking means comprise a mobile locking pin having a locking extremity, the locking pin being mobile between two positions:
  an unlocked position, in which said pin is at least partially disposed within a receiving recess made in said locking unit;
  a locked position in which said locking extremity of said pin protrudes outwards from the internal face of said bracket.

Thus, the locking pin can be likened to a retractable bolt.
In its unlocked position, the pin is retracted into its recess in the locking unit and the locking bracket can then be assembled with or dismantled from the casing without being hindered by the pin in question.

Conversely, in its locked position, the locking extremity of the locking pin protrudes outwards from the internal face of the locking unit so as to get engaged into a locking hole existing on the casing. The locking pin then acts against the disassembly of the locking bracket and the casing, and the bracket is therefore locked to the casing and prevents the extraction of the digital device.

In one particular embodiment, said locking means comprise driving means for driving said mobile locking pin from said locked position to said unlocked position and vice versa.

Thus, an authorized user is able, possibly by using a specific tool, to actuate these driving means so as to lock or unlock the bracket.

In one particular embodiment, the locking extremity of the mobile locking pin takes the form of a T-shaped hook.

In this way, the locking bracket is made compatible with an existing casing that already has a locking slot in a standard format such as for example a Kensington™ type of security slot.

In one particular embodiment, the locking unit comprises an anchor point.

In this way, the locking bracket can also be secured against theft, by using this anchor point to fix the locking bracket to a fixed element of the frame by means of a security cable for example. This anchor point therefore acts as an additional locking cover providing locking in addition to the locking of the bracket to the casing, thus securing the unit formed by a touchpad digital device retained in its casing locked by a locking bracket.

In one particular embodiment, said anchor point takes the form of a locking slot suited to receiving an appropriate lock.

Thus, the additional locking cover function can be provided by using a type of lock widely recognized and commonly available in the market.

In one particular embodiment, the driving means for driving the mobile locking pin:
  protrude outwards from the external face of the locking bracket, at the locking unit, in said unlocked position;
  are disposed within a receiving recess made in the locking unit, in said locked position.

The user can thus, by a mere glance, very quickly know if the locking bracket is locked (the driving means are then retracted into their recess) or unlocked (the driving means have then emerged from their recess and protrude outwards from the locking unit). Thus, the risk that the user may imagine that the bracket is locked although it is not actually locked is limited.

In yet another particular embodiment, in the locked position, said driving means are at least partially covered by a locking device that takes position in said locking slot.

In this way, the protection of the digital device is further reinforced because the means for driving the locking pin cannot be actuated so long as the locking device fixed to the anchor point has not been withdrawn.

In one particular embodiment, said driving means and said locking slot are for example disposed on a same face of said locking unit and are distant from each other by a maximum of nine millimeters.

In this way, when the bracket is locked to the casing (the mobile pin being then in its locked position) and when an additional locking cover function obtained through a standard-sized, commercially available lock (in particular a Kensington™ lock) is applied, the body of this lock at least partly covers the means for driving the locking pin. The body of the lock then counters any actuation of the means for driving the mobile locking pin. Thus, this pin cannot be unlocked so long as the locking cover has not been removed.

The means for driving the mobile locking pin thus prevent the additional locking cover function so long as the pin is not in its locked position.

According to another aspect, the invention also appertains to a system for locking a digital device that comprises:
  a casing adapted to receiving said digital device, said casing comprising at least one locking hole;
  a locking bracket as presented here above, the locking means for locking said bracket being configured to enable the locking of said bracket to the casing, at said casing locking hole, when the bracket is assembled with a casing.

According to one particular embodiment of this system, the casing further comprises:
  at least one mobile means for holding the digital device;
  blocking means for blocking said at least one mobile maintaining means in a predetermined position, said blocking means being active when a locking pin is inserted into the locking hole of said casing.

Thus, the locking of a locking bracket on the casing makes it possible, in addition to implementing securing means proper to the bracket, to activate securing means proper to the casing.

According to yet another aspect, the invention relates to a method for locking a digital device within a casing. This method comprises the following steps:
  a step for inserting the digital device into the casing;
  a step for assembling a locking bracket as presented here above with said casing;
  a step for locking said bracket to said casing, comprising a step for actuating driving means for driving the mobile locking pin of the bracket by means of a specific tool.

In one particular embodiment, said method further comprises, subsequently to the step of locking said bracket to said casing, a step for the additional locking cover of the bracket, comprising a step for affixing a lock to an anchor point present on the locking unit of the bracket.

The different embodiments mentioned here above can be combined with one another to implement the invention.

4. FIGURES

Other features and advantages of the invention shall appear more clearly from the following description of a preferred embodiment, given by way of a simple illustratory and non-exhaustive example and from the appended figures, of which:

FIG. 1 presents a perspective or three-quarter view of a locking bracket in one particular embodiment;

FIG. 2 presents a front view of a casing on which a locking bracket is assembled according to one particular embodiment;

FIG. 3 presents a rear view of a casing presented alone, without a locking bracket in one embodiment;

FIG. 4 presents a rear view of a casing on which a locking bracket is assembled according to one particular embodiment;

5. DETAILED DESCRIPTION

5.1. General Principle

According to its general principle, an exemplary embodiment of the invention proposes a locking bracket to lock a digital device into a casing. Such a locking bracket increases the anti-theft security of the digital device preliminarily installed in the casing. The terms "locking" or "securing" used in the present document therefore refer to the fact that means are implemented to prevent or at least make it a lengthy and difficult task for an unauthorized person to remove a digital device from the casing in which it is placed. By extension, these terms are also used to refer to means applied to guard against the theft of the unit formed by the casing and the digital device that is positioned therein or the unit formed by the casing, the locking bracket that is assembled therein and the digital device that is positioned therein. The digital device in question is any unspecified device: it can especially be a tablet or a smartphone.

According to the proposed technique, the locking bracket is independent of the casing: it is not an integral part of the casing. The casing can indeed be used alone without a bracket and thus achieve a first level of security of the digital device that is placed therein. The locking bracket therefore takes the form of an accessory that can be coupled to the casing to reinforce the protection offered by the unit formed by the casing and the bracket. In all the figures of the present document, the identical elements and steps are designated by a same numerical reference. Naturally, the present technique seeks to reinforce the anti-theft security of a digital device. This digital device is not shown in any of the figures so as not to excessively burden them and so as to make visible certain elements necessary for the understanding of the solution described.

Figure 1:
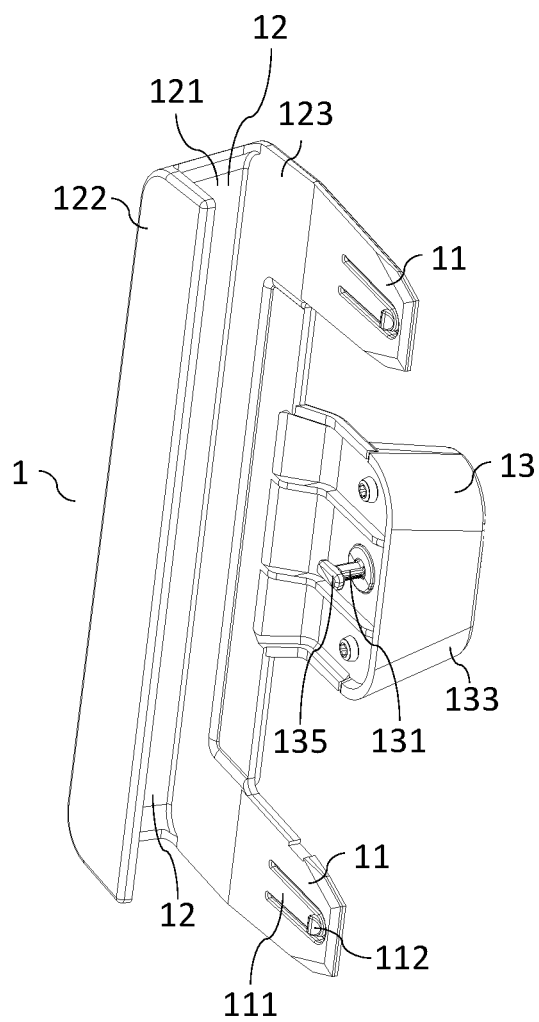

Referring to FIG. 1, we present an example of a locking bracket 1 that is meant to lock a digital touchpad device in a casing in one particular embodiment. FIG. 1 more particularly shows the internal face of the locking bracket 1, i.e. the face that receives at least one portion of the digital device. The external face of this bracket 1—called the external locking face since it comprises means enabling an authorized user to lock it to the casing—will be presented here below, especially with reference to FIGS. 5a, 5b and 5c.

According to the general principle of an exemplary embodiment of the invention, the locking bracket 1 comprises:

- assembly elements 11 for assembling the bracket with the casing;
- retaining elements 12 for retaining the digital device;
- at least one locking unit 13 comprising a lock (131, 132) for locking the bracket to said casing.

These different elements will be presented in greater detail in the description of a specific embodiment of the invention.

Figure 2:
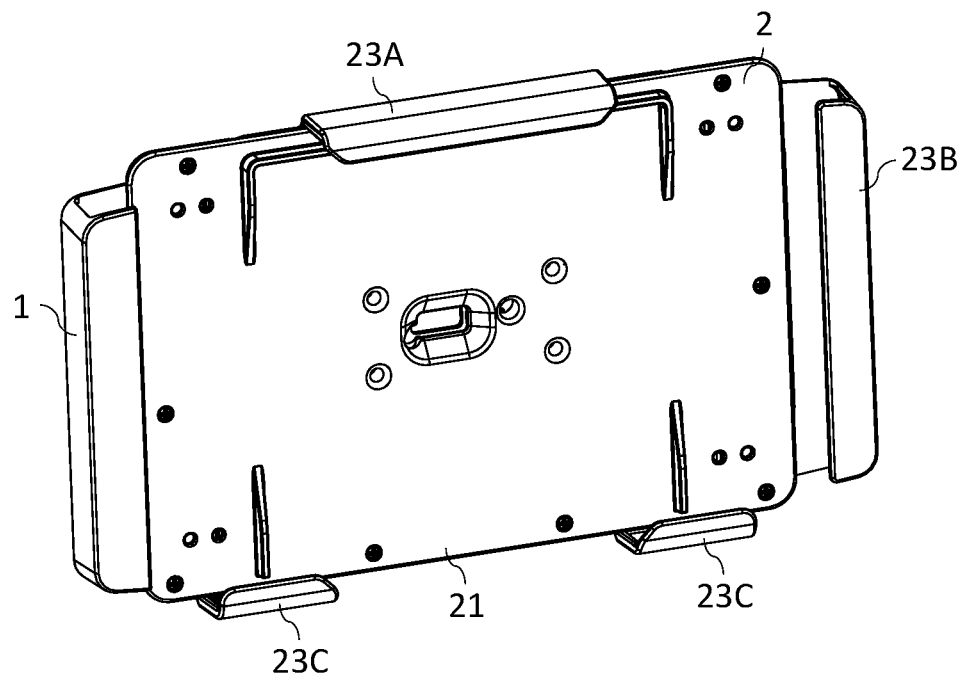
Figure 3:
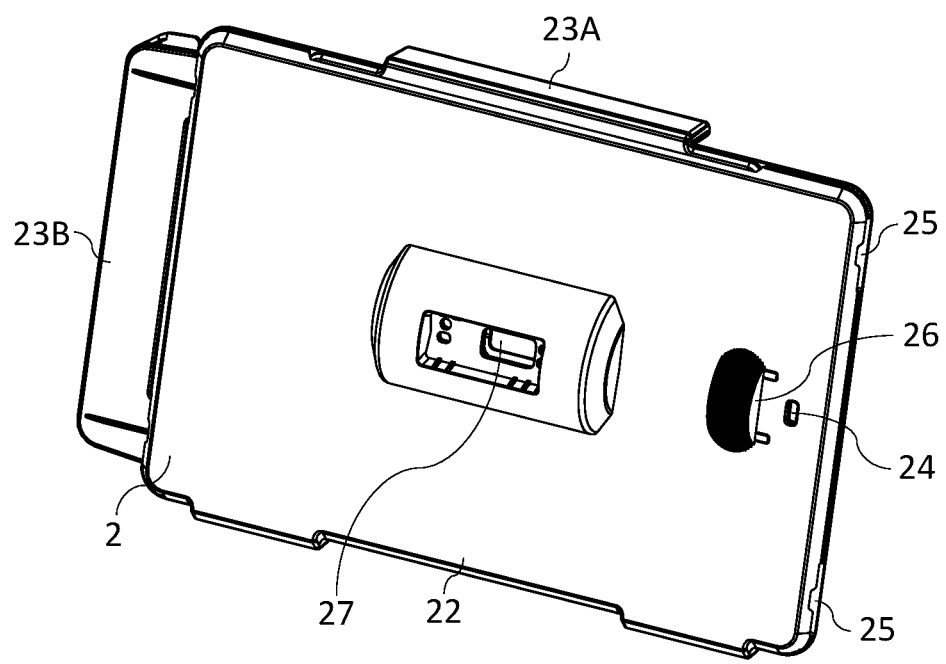
Figure 4:
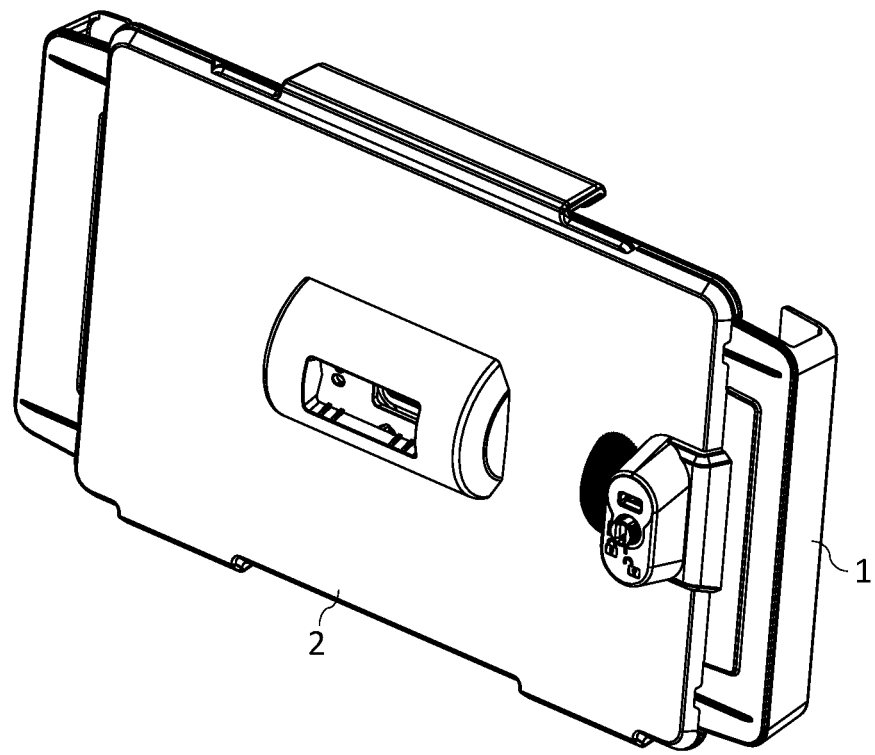

As described here above, the locking bracket is designed to be used jointly with a casing. The term "casing" is understood here to mean a device adapted to receiving and holding a digital device within it. Such a casing is generally designed to enable the user to access all or part of the functions offered by the digital device. For example, the screen of the digital device installed in the casing and possibly certain means for controlling the digital device generally remain accessible. Referring to FIGS. 2 to 4, we present an example of such a casing 2. In FIG. 2, the casing is seen in a front view and a locking bracket 1 is assembled therein. FIGS. 3 and 4 for their part show the casing seen in a rear view, respectively without (FIG. 3) and with (FIG. 4) a locking bracket 1.

The casing 2 has a generally rectangular parallelepiped shape. It comprises a front facade 21 and a rear facade 22. These two facades have a generally rectangular shape and have appreciably equivalent dimensions. They are assembled with each other so as to form the body of the casing 2. The external face of the front facade 21 acts as a surface to receive the digital device: it is on this face that the back of the digital device rests at least partly when it is installed in the casing. The casing 2 also comprises a holding element for holding the digital device. In the particular embodiment of the casing presented with reference to FIGS. 2 to 4, the holding element takes the form of grooves (23A, 23B, 23C) disposed on three sides of the casing. Each of these grooves is meant to receive one side of the digital device installed in the casing to ensure that it is held. When there is no locking bracket assembled with the casing, the fourth side of the casing is left free. In other words, this fourth side does not include any groove proper to the casing: it acts as a free, open side through which the digital device can be inserted within the casing through a motion of translation. More particularly, during this insertion, the grooves 23A and 23C placed facing each other on either side of the casing act as grooves for guiding the digital device while the groove 23B, placed so as to be facing the free side, acts as a travel limit stop groove. At this stage, it must be noted that the casing 2, considered by itself and without any locking bracket, then truly and fully constitutes a holding device for holding a digital device. Once inserted into such a casing 2, the back of the digital device rests on the external face of the front facade 21. Its base lies on the bottom of the grooves 23C or 23B (depending on whether its orientation is horizontal or vertical, i.e. in landscape mode or in portrait mode) and the front walls of the grooves (especially the walls of the groove 23A) prevent any forward tilting of the digital device. The casing 2 can therefore be used independently, without the locking bracket 1 being assembled therein. In addition to holding the digital device, the casing on its own can also offer a first level of security for the digital device placed therein. The groove 23A can for example be a mobile groove, the position of which can be adjusted and blocked after the digital device is installed so that this device is gripped by the grooves 23A and 23C that face each other. Thus, so long as the position of the groove 23A is kept blocked, it becomes difficult to remove the digital device by the free side of the casing since the friction forces exerted by the grooves on the digital device work against the translation motion needed to extract it. This difficulty can be further increased when the bottom of the grooves in question include a grip, for example a rubber grip, further increasing these frictional forces. The position of the groove 23A can be unblocked, for example, by an authorized user through the actuation of an unblocking element that takes the form of the button 26 that can be seen in FIG. 3 for example. Means preventing an unauthorized person from actuating this button 26 shall be described further below in this document with reference to FIG. 7.

The casing 2 also generally comprises an anchor point, typically a locking hole suited to receiving an appropriate lock. Such a locking hole 24 can especially be seen in FIG. 3 which presents a rear view of the casing alone. This locking hole 24 provides anti-theft security to the unit formed by the casing 2 and the digital device placed therein. It enables the casing 2 to be attached to a fixed element of the frame by means of a security cable provided with a lock for example. This locking hole 24 can especially take the form of a Kensington™ type security slot. This additional security provided through the locking hole 24 can be implemented alternatively or as an addition to the affixing of the casing 2 to a cradle, possibly operated through means of affixation 27 to a dedicated cradle present on the casing.

It can be seen, from the description, that the casing presented is sufficient by itself to provide the holding function and a first level of security for a digital device that is placed therein. This first level of security can nevertheless prove to be inadequate in certain configurations, and the locking bracket of the proposed technique is then aimed at offering a means to increase the level of security without having to replace the casing in question.

Here below, we describe a specific embodiment of a locking bracket related to the general principle that has been described.

5.2. Detailed Description of One Embodiment

As described here above, a locking bracket as proposed is intended for use in addition to a casing. The locking bracket however does not form part of the casing: this casing is independent and can even, in certain embodiments, already comprise its own means for securing a digital device positioned therein, as an addition to holding elements. In this respect, the locking bracket can be considered as an accessory that could be assembled with a casing in order to increase the level of security offered by this casing. Hence, the assembly and locking of this locking bracket on the casing serve to make it even more difficult for a malicious individual to try and steal the digital device.

We shall now provide a detailed description of the main elements of a locking bracket in the particular embodiment illustrated in FIGS. 1 to 7. It is understood that the embodiment in no way limits the scope of the invention. More particularly, in other embodiments of the invention, the elements for assembling, retaining and locking the locking bracket are not limited to those described here below.

Assembling Elements

In this particular embodiment, the elements for assembling the locking bracket 1 with the casing take the form of assembling tabs 11 that can be seen for example in FIG. 1. The bracket 1 is assembled with the casing by engaging these assembling tabs 11 into complementary recesses of the casing (as is shown in FIG. 4 especially). The entry holes 25 of these recesses can be seen in FIG. 3. These holes are situated on the free side of the casing, i.e. on the side without holding elements proper to the casing. In this embodiment, the purpose of the locking bracket is indeed, after the digital device has been placed in the casing, to close the free side of the casing that usually serves to insert or remove the digital device.

According to one particular characteristic, the assembling tabs 11 can include means for clipping them on to the casing. In the example of FIG. 1, each assembling tab 11 thus comprises a pre-cut strip 111 at the end of which a protrusion acts as a clip-on piece 112. When the assembling tabs 11 are inserted into their complementary recesses, the pre-cut strips 111 undergo slight elastic deformation until the clip-on pieces 112 face complementary cavities in the casing and take position therein under the effect of the elastic return force. The clip-on effect is thus provided. The locking bracket can be removed "by force": a sufficient traction force on the bracket is enough to unblock the clip-on pieces. The primary role of these clip-on pieces 112 is not to lock the bracket to the casing: they serve above all to ensure accurate positioning of the locking bracket relative to the casing in order to enable its subsequent locking. Such an accurate positioning consists especially in aligning an exit hole of a locking pin 131 (which is described here below) of the locking unit 13 with the locking hole 24 present in the rear of the casing.

According to various possible characteristics, the locking tabs 11 and the complementary recesses of the casing are shaped and sized so as to prevent any skewed assembling (using a guide) or incorrect assembly (using means of accurate positioning). For example, the shape of the profile of the assembling tabs 11 and the shape of the complementary entry holes 25 of the casing are designed so that any "incorrect" assembly of the locking bracket that could damage the bracket and/or the casing, is not possible.

In the embodiment illustrated, the assembling tabs 11 extend in a plane that appreciably coincides with a junction plane of the front and rear facades of the casing when the locking bracket 1 is assembled with the casing 2 (as can be seen in FIG. 4). It worth noting that such a plane demarcates two distinct functional spaces of the locking bracket 1: a front space in which the retaining elements 12 for holding the digital device are situated and a rear space in which is placed the locking unit 13 comprising a lock for locking the bracket to the casing.

Retaining Elements

The locking bracket also includes retaining elements for retaining the digital device preliminarily inserted into the casing. In the particular embodiment illustrated for example in FIG. 1, these retaining elements take the form of a groove 12 into which one of the sides of the digital device gets engaged when the locking bracket is assembled with the casing (the other sides of the tablet being for example already held by holding elements 23A, 23B and 23C for holding the casing). More specifically, the groove 12 has a U-shape: it includes a bottom 121 and two lateral walls (a front wall 122 and a rear wall 123). The bottom 121 serves as a stop to the side of the tablet engaged in the groove 12. In this respect, it is this bottom 121 that mainly acts against the withdrawal of the digital device from the casing, once the locking bracket has been assembled.

Other shapes of retaining elements can clearly be envisaged in the context of the present invention, in other embodiments. The choice of these shapes can especially be guided by the shape and the number of holding elements already present in the casing. The goal is that the joint action of the holding elements of the casing on the one hand and the retaining elements of the locking bracket on the other hand eliminate any degree of freedom of the digital device sufficient to enable its extraction from the casing. For example, the retaining elements of a locking bracket to be used with a casing such as the one shown in FIG. 2 could take an "L" shape (a shape that corresponds to that of the groove 12 minus its front wall 122). Indeed, the holding elements (23A, 23B, 23C) proper to the casing already by themselves prevent any extraction (from the front) of the digital device and the presence of a front wall 122 on the locking bracket is in this respect not absolutely necessary for this particular casing configuration.

Locking Unit

In addition to the assembling elements on the casing and the retaining elements, the locking bracket includes at least one locking unit to lock the affixation of the bracket to the casing. To this effect, the locking unit comprises a lock for locking the bracket to the casing. The locking unit therefore seeks to prevent the dismantling of the locking bracket (i.e. its dismantling from the casing) by an unauthorized person.

It may be recalled that the retaining elements retain the digital device in the casing once the locking bracket is assembled with the casing. Thus, the three main elements of the locking bracket—assembling elements, retaining elements and locking unit—cooperate to counter any unauthorized withdrawal of a digital device preliminarily installed in the casing.

FIG. 1 shows the locking bracket 1 alone, not assembled with a casing, with the internal face visible (this internal face corresponds to the reception face of at least one portion of the digital device). This figure also shows the internal face of the locking unit 13, brought to a position where it faces the back of the casing once the bracket is assembled with the casing. The external face of the locking unit 13 for its part can be seen on FIGS. 5a, 5b and 5c, each of which showing a detailed view of the locking unit 13 of the bracket assembled with a casing, respectively in a position where the bracket is unlocked (FIG. 5a), being locked (FIG. 5b) and locked (FIG. 5c).

The lock for locking the locking unit 13 comprises especially a locking pin 131. This locking pin 131, preferably made of metal, is formed by a rod, in the extension of which there is a locking extremity 135. This locking pin 131 is mobile between two positions: a locked position and an unlocked position.

In its unlocked position, the locking pin 131 is at least partially disposed within a receiving recess made in the locking unit 13. This position permits the assembling of the locking bracket on the casing and its dismantling from the casing. Indeed, in this position, the locking pin 131 is sufficiently withdrawn into its receiving recess so that it does not block the total sliding of the assembling tabs 11 in their complementary recesses made in the casing.

As already explained here above in the description of the assembling elements, if the locking bracket has been correctly assembled with the casing, the exit hole of the locking rod (in other words the hole of the above-mentioned receiving recess) is aligned with a locking hole 24 present in the rear of the casing. The locked position can then be obtained.

In this locked position, the locking extremity 135 of the pin 131 protrudes outwards from the internal face of the locking bracket (i.e. towards the exterior of the internal face of the locking unit 13). This locking extremity 135 (as well as, possibly, a part of the rod of the locking pin 131) then penetrates the complementary locking hole 24 of the casing. The locking pin 131 then works against the dismantling of the locking bracket and of the casing.

The locking pin 131 can therefore be likened to a retractable bolt.

According to one particular characteristic, the locking extremity 135 of the locking pin 131 takes the form of a T-shaped hook (as illustrated in FIG. 1). For example, the locking extremity can take the form of a Kensington™ type hook. The locking bracket is thus made compatible with an existing casing that already has a locking slot in the standard Kensington™ format. It must also be noted that a simple translation of the locking pin 131 in the axis of its rod is enough to ensure the locking or unlocking of the bracket, provided that the locking extremity 135 is accurately oriented to cross the locking hole 24 of the casing. However, according to another particular characteristic, this translation motion can be accompanied by or supplemented by a rotational movement about the axis of the rod of the pin, especially once the locking extremity 135 has completely gone through the locking hole 24 of the casing and is therefore inside the casing. Such a rotation has a purpose when the locking hole 24 of the casing is not circular but is slot-shaped for example. It then further reinforces the locking of the bracket by making it more difficult to carry out any attempt to break or pull off the locking unit 13. Indeed, the orientation of the locking extremity 135 then does not enable its extraction by simple translation because the upper bar of the "T" formed by the locking extremity 135 abuts the internal face of the rear facade 22 of the casing, preventing passage through the locking hole 24.

Figure 5A:
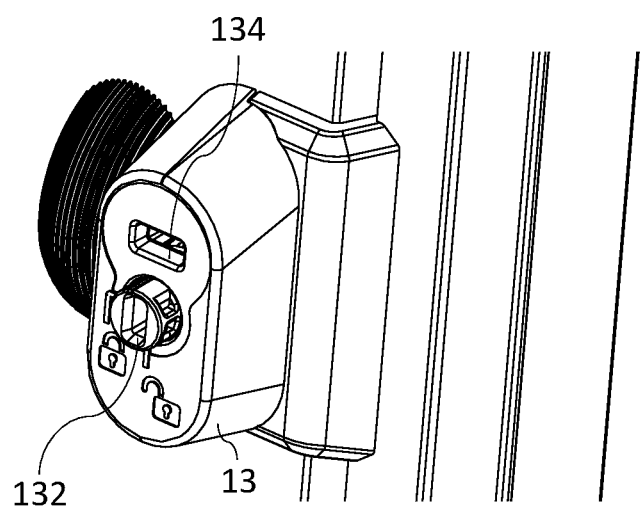
FIGS. 5a, 5b and 5c are detailed close-up views of the locking unit for locking a locking bracket, respectively in an unlocked position (FIG. 5a), a position in which it is being locked (FIG. 5b), and a in locked position (FIG. 5c), in one particular embodiment.
Figure 5B:
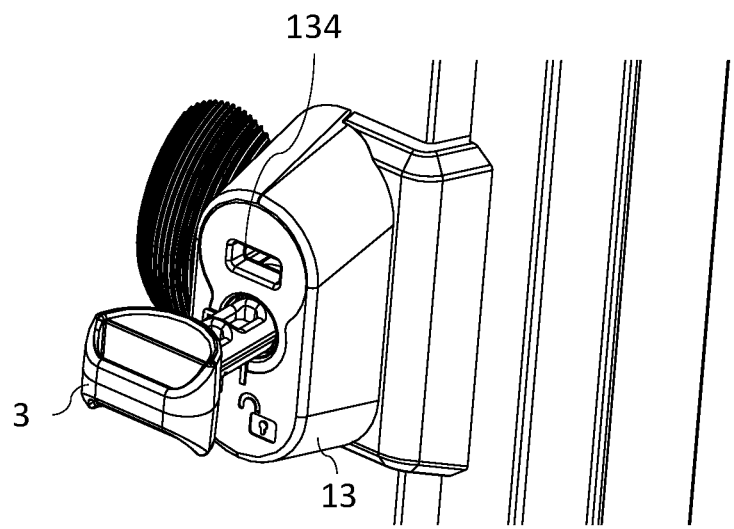
Figure 5C:
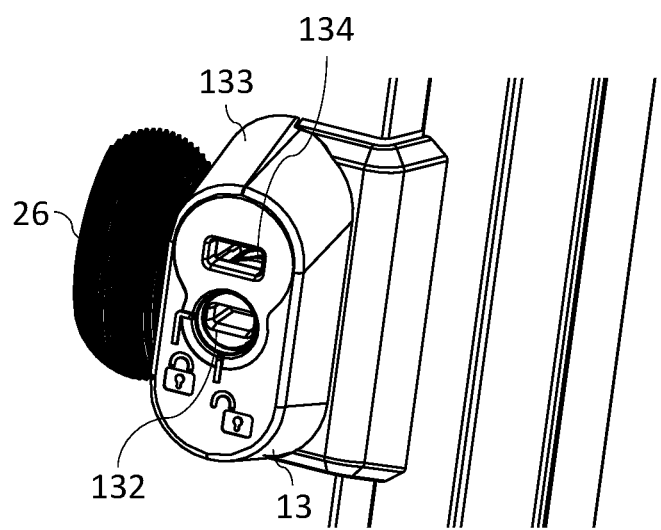
Figure 6:
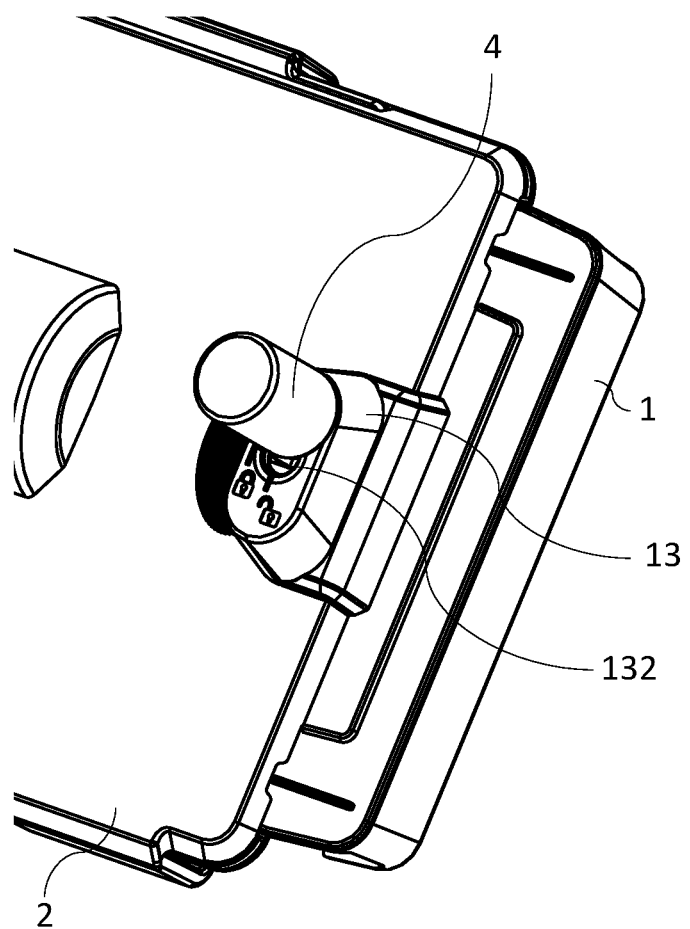
FIG. 6 illustrates an example of implementation of an additional locking cover of a locking bracket preliminarily locked to a casing (partial view) in one particular embodiment.

The locking element also comprises a driving element 132, seen for example in FIGS. 5a and 5c, for driving the mobile locking pin 131. When the driving element is actuated by the user, it drives the motion of the locking pin 131. More particularly, depending on the sense in which the driving element is actuated, the driving element drives the locking pin from its locked position to its unlocked position, or vice versa.

In one particular embodiment, the driving element 132 is accessible on the external face of the locking bracket and more particularly on an external face of the locking unit 13. According to one particular characteristic, a specific tool (such as the tool 3 which can be seen in FIG. 5b) can be asked to actuate the driving element 132. Such a specific tool can especially take the form of a key made available to the person authorized to lock or unlock the locking bracket.

In one particular embodiment, the driving element 132 protrudes outwards on the external face of the locking unit 13 in the unlocked position described here above. On the contrary, in the previously described locked position: it is disposed within a receiving recess made in the locking unit 13. Thus, the user can very rapidly and at a glance find out whether the locking bracket is locked (the driving element 132 is then retracted into the recess as presented in FIG. 5c) or unlocked (the driving element 132 is then out of the recess and protrude outwards from the locking unit 13 as presented in FIG. 5a). This visual indication advantageously supplements the more classic but sometimes less visible visual indications such as for example pictograms that may be inscribed on the locking unit relative to each position. Thus, the risk that the user will imagine the bracket to be locked whereas it is actually not locked is limited.

In one particular embodiment, the locking unit also comprises an anchor point. Such an anchor point enables the locking bracket to be affixed to a fixed element of the frame, for example by means of a security cable provided with an appropriate lock. This anchor point acts as an additional locking cover since it permits locking additional to the locking of the bracket to the casing in making it possible to secure the unit formed by a digital touchpad device retained in its casing locked itself by a locking bracket. Such an additional locking can especially prove to be worthwhile when the casing is not permanently attached to a fixed cradle.

This anchor point can take different forms such as for example that of a ring. In the embodiment illustrated in FIGS. 4 to 6, the anchor point takes the form of a locking slot 134 adapted to receiving an appropriate lock. According to one particular characteristic, this locking slot 134 is a Kensington™ type security slot that meets precise specifications on dimensions and type of metal that can be used as a reinforcement piece. In this way, the additional locking cover—in other words, the security of the locking bracket implemented by means of this locking slot—can be obtained by using a type of lock widely recognized for its reliability and commonly available in the market.

In one particular embodiment, the driving element 132 for driving the locking pin 131 is positioned so as to be partially covered by a locking device that takes position in the locking slot 134. The driving element 132 and the locking slot 134 is for example disposed on a same face of the locking unit 13 and are distant from each other by a distance such that the body of a commercially available standard-sized lock adapted to taking position in the locking slot 134, once locked in this slot, covers the driving element 132 to an extent sufficient to prevent its actuation. According to one particular characteristic, when the locking slot 134 is a Kensington™ type security slot, the driving element 132 and the locking slot 134 are distant from each other by a maximum of 9 millimeters (center-to-center distance): it is ensured thus that the cylindrical body of a Kensington™ lock, the diameter of which is standardized (19.1 millimeters), at least partially covers the driving element once the lock is engaged in the locking slot 134. Such a configuration is illustrated for example in FIG. 6, in which the driving element 132 is seen to be partially covered by the body 4 of a lock fixed to the anchor point 134 of the locking unit (the security cable connecting this lock to the frame is not shown in FIG. 6).

Such a configuration has numerous advantages. In particular, the body 4 of the lock prevents any actuation of the driving element 132 of the mobile locking pin. The lock 4 therefore must be removed to be able to actuate the driving element of the locking pin and unlock the locking bracket. The anti-theft protection of the digital device is therefore further reinforced.

Besides, it is particularly useful to combine this embodiment with the one described here above, where the driving element 132 protrudes outwards from the locking unit in the unlocked position and is retracted into the locking unit in the locked position. Indeed, in this situation, the additional locking cover of the bracket in the locking slot 134 cannot be implemented so long as the locking bracket is not in the locked position: so long as this position is not attained, the driving element 132 indeed forms a protrusion that extends outwards from the locking unit, and prevents the affixation of a lock in the locking slot 134. The risk that the user will forget to lock the locking bracket to the frame is then greatly limited, or even almost inexistent once the user uses the locking slot 134 as an additional locking cover: it is indeed improbable that a user will forget both to lock the locking bracket to the frame and to provide a additional locking cover by locking the locking bracket to the frame.

The characteristics present in the different embodiments described here above can of course be combined with each other without departing from the framework of the invention.

5.3. Locking System

According to another aspect, the invention also relates to a system for locking a digital device. Such a system comprises firstly a casing adapted to receiving a digital device and secondly a locking bracket as presented here above. The casing comprises at least one locking hole, for example a locking slot in the standard format such as the slot 24 which is visible in FIG. 3. One example of such a casing has already been presented during the description of the general principle of the locking bracket. The lock for locking the bracket to the casing, present in the bracket, are configured to enable the bracket to be locked with the locking hole of the casing, once the locking bracket has been assembled with the casing. For example, the locking pin and its locking extremity are shaped and sized in such a way as to get inserted into the locking hole of the casing, when the locking bracket is completely assembled with the casing.

In one particular embodiment, the casing comprises assembling elements complementary to the assembling elements of the locking bracket. For example, the casing comprises recesses to receive assembling tabs present on the locking bracket (the entry holes 25 of such recesses can be seen for example in FIG. 3). It must be noted however that that the presence, in the casing, of assembling elements additional to the assembling elements of the locking register is not a limiting characteristic of the locking system according to the proposed technique. Indeed, in another embodiment, the casing does not include such additional assembling elements and it is the assembling elements present on the locking bracket alone that provide the assembling of the bracket on the casing (for example, the assembling elements can take the form of at least one groove, in which one side of the casing takes position when the bracket is assembled with the casing: the casing then does not have additional means specifically planned for the assembling of a locking bracket).

In one particular embodiment, the casing further comprises:
  at least one mobile holding element of the digital device;
  a blocking element or block for blocking said at least one mobile holding element in a predetermined position, said blocking element being active when a locking pin is inserted into the locking hole of said casing.

Figure 7:
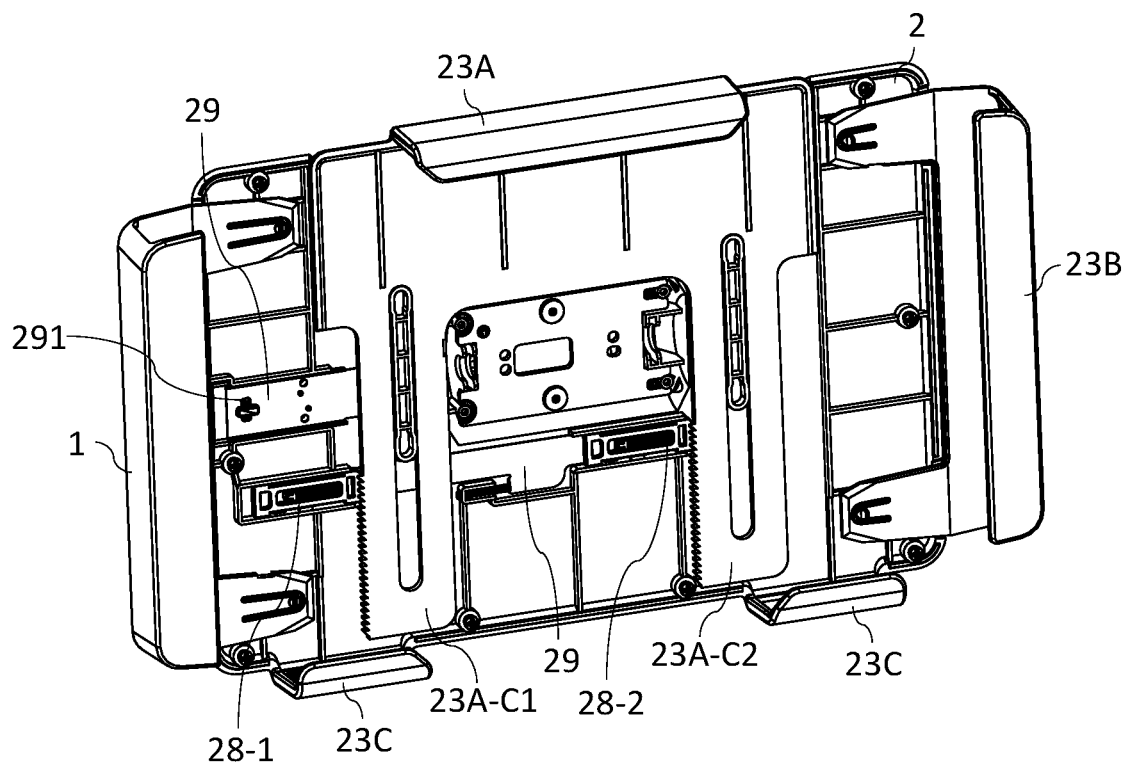
FIG. 7 shows a front view of a casing on which a locking bracket is assembled according to one particular embodiment, the casing being shown without its front facade.

An embodiment of this kind is for example illustrated with reference to FIG. 7 which shows as casing 2 seen from the front but the front facade of which has been removed to reveal the interior of the casing. The principle of this embodiment has already been partially described in the general presentation of an example of a casing: the groove 23A is a mobile holding element for the digital device, the position of which can be adjusted and blocked subsequently to the installation of the digital device within the casing 2, so that the grooves 23A and 23C that face each other grip the digital device and make its extraction difficult. We shall now describe the block used to block the position of this groove 23A. In the particular embodiment illustrated in FIG. 7, the rear wall of the mobile groove 23A extends in the form of racks (23A-C1, 23A-C2) within the casing 2. Rack locks (28-1, 28-2) are fixedly attached to a mobile plate 29 disposed within the casing 2 and supporting the button 26 (which can be seen in FIG. 3). The mobile plate 29 and the rack locks (28-1, 28-2) together form blocking elements used to block the position of the groove 23A in a determined position. When a user actuates the button 26, the mobile plate 29 shifts and the rack locks (28-1, 28-2) release the racks (23A-C1, 23A-C2): the groove 23A can then be shifted.

When the button 26 is not actuated, an elastic return maintains the button 26, the mobile plate 29 and the rack locks (28-1, 28-2) in a rack blocking position (23A-C1, 23A-C2). In this configuration, a locking hole 291 present on the mobile plate 29 is situated facing the locking hole 24 of the casing. In this way, a locking pin inserted into the locking hole 24 of the casing also passes through the locking hole 291 of the mobile plate 29, then countering the movement of this plate 29 within the casing 2. So long as this locking pin is not withdrawn, the position of the groove 23A is blocked and the button 26 cannot be actuated. Through this mechanism, the casing 2 therefore itself has means to secure the digital device that is installed therein, which can be implemented once the locking hole 24 of the casing is used. Since the locking of a locking bracket on the casing relies precisely on the use of this locking hole 24, these securing means proper to the casing are automatically implemented once a locking bracket is assembled with the casing. The use of a locking bracket as proposed therefore enables the securing means of the digital device inserted into the casing to be combined. The security level of this digital device is therefore further improved.

According to one particular characteristic, to further reinforce this level of security, the body of the locking unit of the bracket can be shaped and sized so as to block the travel of the button 26 when the locking bracket is assembled with the casing. This situation is illustrated as an example in FIG. 5c: the body 133 of the locking unit 13 abuts the button 26, eliminating all its latitude of movement. The travel of the button 26 is therefore doubly blocked, on the one hand by the locking pin 131 of the bracket which prevents any movement of the mobile plate 29 and therefore of the button 26 that it supports and, on the other hand, by the body 113 of the locking unit 13 which hinders the shifting of the button 26.

5.4. Locking Method

Figure 8:
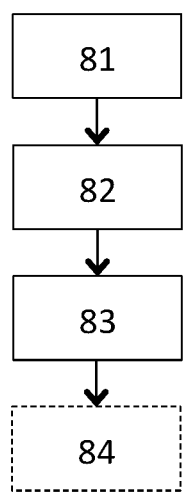
FIG. 8 illustrates the main steps of a method for locking a digital device within a casing in one particular embodiment.

Referring to another aspect, a description is also provided of a method for locking a digital device within a frame. Referring to FIG. 8, we describe the main steps implemented by the user to carry out such a locking, in one particular embodiment.

During a first step 81, the digital device is inserted into the casing, for example by a free side of the casing (i.e. a side without any holding elements). Once the digital device is completely introduced into the casing, it is possible, if a holding means present on the casing is mobile and takes, for example, the shape of a mobile groove as described here above, to lower this mobile groove so as to grip the digital device. Thus, a first level of security in the casing is implemented: the friction forces exerted on the size of the digital device act against its extraction from the casing.

Then, in a step 82, a locking bracket as described here above is assembled with said casing. To this end, for example assembling tabs to assemble the locking bracket in complementary recesses of the casing are introduced up to a clip-on point indicating that the locking bracket is accurately assembled: at this point, the retaining elements for retaining the locking bracket retain the digital device in the casing and the entry hole of the recess for receiving the locking pin (made in the locking unit of the locking bracket) is situated so as to be facing a locking hole present on the back of the casing.

The bracket is then locked into the casing, in a step 83. This step, using a specific tool if necessary, actuates the driving element for driving the mobile locking pin of the locking bracket. The locking pin is then driven up to its locking position: its locking extremity protrudes from the locking unit and penetrates the complementary locking hole of the casing. This configuration corresponds to a second level of security: the locking bracket closes the free side of the casing and counters the removal of the digital device and it cannot be dismantled (i.e. separated from the casing) so long as the driving element for driving the locking pin has not been actuated in the other direction.

Optionally, in an additional step 84, an additional locking cover of the bracket is carried out: the anchor point present on the locking unit is then used to affix the assembly formed by the casing, the locking bracket and the digital device to a fixed element of the frame, for example using a security cable provided with an appropriate lock. The body of this lock then, in one particular embodiment of the proposed technique, covers the driving element for driving the locking pin, thus providing an additional increase in the level of security offered by the system as a whole.

The invention claimed is:

1. A locking bracket for locking a digital device preliminarily inserted into a casing, said locking bracket comprising:
   an internal face for receiving at least one portion of said digital device;
   an external locking face;
   an assembly element configured to assemble the locking bracket with said casing;
   a retaining element configured to retain said digital device;
   at least one locking unit comprising:
      a lock for locking the locking bracket to said casing, said lock comprising a mobile locking pin having a locking extremity, the locking pin being mobile between:
         an unlocked position, in which said mobile locking pin is at least partially disposed within a receiving recess made in said at least one locking unit so as to allow the assembly element to assemble the locking bracket, as a single element, with said casing; and
         a locked position in which said locking extremity of said mobile locking pin protrudes outwards from the internal face of said locking bracket;
      a drive for driving said mobile locking pin from said locked position to said unlocked position and vice versa;
      an anchor point taking the form of a locking slot adapted to receiving an appropriate locking device;
      the drive and the anchor point being further configured so that:
         in said unlocked position, the drive protrudes outwards from the external face of said locking bracket, at the at least one locking unit, preventing a locking device to take position in said locking slot;
         in said locked position, the drive is disposed within a receiving recess in said at least one locking unit, and is partially coverable by a locking device that can take position in said locking slot.

2. The locking bracket according to claim 1, wherein said locking extremity of said mobile locking pin takes the form of a T-shaped hook.

3. The locking bracket according to claim 1, wherein said drive and said locking slot are disposed on a same face of said at least one locking unit and are distant from each other by a maximum of nine millimeters.

4. A system for locking a digital device comprising:
   a casing adapted to receiving said digital device, said casing comprising at least one locking hole; and
   a locking bracket comprising:
      an internal face for receiving at least one portion of said digital device;
      an external locking face;
      an assembly element configured to assemble the locking bracket with said casing;
      a retaining element configured to retain said digital device; and
      at least one locking unit comprising:
         a lock for locking the locking bracket to the casing, at the at least one locking hole of said casing, when the locking bracket is assembled with said casing, the lock comprising a mobile locking pin having a locking extremity, the locking pin being mobile between:
- an unlocked position, in which said mobile locking pin is at least partially disposed within a receiving recess made in said at least one locking unit so as to allow the assembly element to assemble the locking bracket, as a single element, with said casing; and
- a locked position in which said locking extremity of said mobile locking pin protrudes outwards from the internal face of said locking bracket;

a drive for driving said mobile locking pin from said locked position to said unlocked position and vice versa;

an anchor point taking the form of a locking slot adapted to receiving an appropriate locking device;

the drive and the anchor point being further configured so that:
- in said unlocked position, the drive protrudes outwards from the external face of said locking bracket, at the at least one locking unit, preventing a locking device to take position in said locking slot;
- in said locked position, the drive is disposed within a receiving recess in said at least one locking unit, and is partially coverable by a locking device that can take position in said locking slot.

5. The system for locking a digital device according to claim 4, wherein said casing further comprises:
- at least one mobile holding element for holding the digital device;
- a block, which blocks said at least one mobile holding element in a predetermined position, said block being active when at least one locking pin is inserted into the at least one locking hole of said casing.

6. A method for locking a digital device within a casing, said method comprising:
- inserting said digital device into said casing;
- assembling, with said casing, a locking bracket comprising:
  - an internal face for receiving at least one portion of said digital device;
  - an external locking face;
  - an assembly element configured to assemble the locking bracket with said casing;
  - a retaining element configured to retain said digital device; and
  - at least one locking unit comprising:
    - a lock for locking the locking bracket to said casing, said lock comprising a mobile locking pin having a locking extremity, the mobile locking pin being mobile between:
      - an unlocked position, in which said mobile locking pin is at least partially disposed within a receiving recess made in said at least one locking unit so as to allow the assembly element to assemble the locking bracket, as a single element, with said casing; and
      - a locked position in which said locking extremity of said mobile locking pin protrudes outwards from the internal face of said locking bracket;
    - a drive for driving said mobile locking pin from said locked position to said unlocked position and vice versa;
    - an anchor point taking the form of a locking slot adapted to receiving an appropriate locking device;
    - the drive and the anchor point being further configured so that:
      - in said unlocked position, the drive protrudes outwards from the external face of said locking bracket, at the at least one locking unit, preventing a locking device to take position in said locking slot;
      - in said locked position, the drive is disposed within a receiving recess in said at least one locking unit, and is partially coverable by a locking device that can take position in said locking slot; and
- locking said locking bracket to said casing, comprising actuating said drive using a specific tool to drive the mobile locking pin of the locking bracket from said unlocked position to said locked position.

7. The method for locking according to claim 6, further comprising, subsequently to locking said locking bracket to said casing, providing an additional locking cover for the locking bracket, comprising affixing the locking device to the anchor point present on the at least one locking unit of the locking bracket.

* * * * *